United States Patent [19]
Dam et al.

[11] Patent Number: 5,738,768
[45] Date of Patent: Apr. 14, 1998

[54] PROCESS FOR REDUCING PARTICLE DEFECTS IN ARC VAPOR DEPOSITION COATINGS

[75] Inventors: Chuong Q. Dam; Laura M. VanLanen, both of Peoria, Ill.

[73] Assignee: Caterpillar Inc., Peoria, Ill.

[21] Appl. No.: 551,099

[22] Filed: Oct. 31, 1995

[51] Int. Cl.$^6$ .............................. C23C 14/00; B23K 9/28
[52] U.S. Cl. .................... 204/192.38; 204/298.4; 427/530; 427/528; 427/566; 427/580; 118/723 VE; 219/137.2; 219/137.43
[58] Field of Search ...................... 427/561, 566, 427/528, 530, 580, 585, 597, 458; 219/121.35, 137.2, 137.31, 137.43; 204/192.38, 298.41; 118/723 VE, 625, 628

[56] References Cited

U.S. PATENT DOCUMENTS

| | | | |
|---|---|---|---|
| 3,069,286 | 12/1962 | Hall | 427/537 |
| 4,495,044 | 1/1985 | Banks | 427/580 |
| 4,904,528 | 2/1990 | Gupta et al. | 427/580 |
| 4,929,321 | 5/1990 | Buhl | 204/298.41 |
| 4,931,306 | 6/1990 | Pinkhasov | 427/580 |
| 4,982,696 | 1/1991 | Kinoshita et al. | 427/566 |
| 4,994,164 | 2/1991 | Bernardet et al. | 204/298.41 |
| 5,108,778 | 4/1992 | Suzuki et al. | 427/596 |
| 5,208,079 | 5/1993 | Fukushima et al. | 427/528 |
| 5,269,898 | 12/1993 | Welty | 204/192.38 |
| 5,279,723 | 1/1994 | Falabella et al. | 427/580 |
| 5,282,944 | 2/1994 | Sanders et al. | 427/580 |
| 5,374,456 | 12/1994 | Matossian et al. | 427/458 |
| 5,401,543 | 3/1995 | O'Neill et al. | 204/298.41 |
| 5,433,836 | 7/1995 | Martin et al. | 204/298.41 |
| 5,503,725 | 4/1996 | Sable et al. | 204/192.38 |

OTHER PUBLICATIONS

White, Harry J.; "Modern Electrical Precipitation", *Industrial Engineering and Chemistry*; vol. 47, No. 5, pp. 932–939; May 1955 427/458.

*Primary Examiner*—Marianne Padgett
*Attorney, Agent, or Firm*—Pankaj M. Khosla

[57] ABSTRACT

A process for reducing particle defects in an arc vapor deposition coating on a substrate comprises the steps of providing a metallic wire mesh, providing an arc source adapted to impart a positive charge on coating macroparticles produced during arc vapor deposition, positioning the wire mesh in between the arc source and the substrate, applying a negative bias voltage to the wire mesh and entrapping positively charged macroparticles on the negatively charged wire mesh during coating deposition.

14 Claims, 4 Drawing Sheets
(3 or 4 Drawing(s) in Color)

Fig_1_

Fig_4_
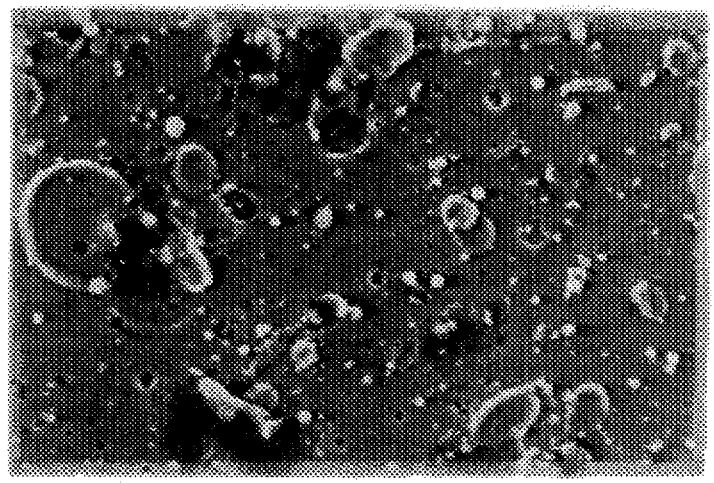
Fig_5_
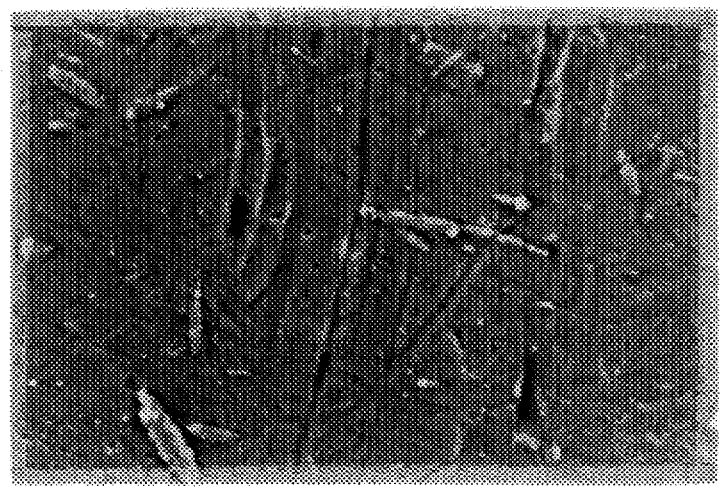

/ 1

PROCESS FOR REDUCING PARTICLE DEFECTS IN ARC VAPOR DEPOSITION COATINGS

TECHNICAL FIELD

The present invention relates generally to arc vapor deposition coating techniques, and more particularly to a process for reducing particle defects in arc vapor deposition coatings.

BACKGROUND ART

Coatings deposited by arc vapor deposition techniques are widely used to coat metal and ceramic substrates for improving their wear resistance.

One of the drawbacks of arc vapor deposition coatings is that the arc vapor deposition process inherently results in the production of macroparticles of the deposited material. These macroparticles usually range from 0.1 μm to 5 μm in size and get deposited on the coating surfaces. Most of the macroparticles are loosely bonded to the coating surfaces, detrimentally affecting the mechanical integrity of the coating. When these macroparticles fall off the coating surfaces, they leave voids in the coating surface and these voids cause the coated substrate to be exposed to the elements.

Various methods have been developed by the coatings industry to eliminate these macroparticles. One such method is the use of electromagnetic tunnels during the arc vapor deposition process. This method usually requires expensive equipment and imposes an undesirable limitation on the surface geometry of the coated article and is not suitable for the production of low volume parts. Most other methods greatly reduce the deposition rate and the coating area It has been desirable to provide a system for arc vapor deposition that has improved manufacturing capabilities and avoids the waste of time, labor, equipment and natural resources. It has been further desirable to provide a process that allows the flexibility of coating articles with various surface geometries without reducing the deposition rate or the coating area. It is the purpose of this invention to provide a process for reducing by weight percent, the amount of macroparticles having a particle size of at least 0.1 μm, deposited on a substrate during arc vapor deposition process.

The present invention is directed to overcome one or more problems of heretofore utilized systems.

DISCLOSURE OF THE INVENTION

In one aspect of the present invention, a process for reducing particle defects in an arc vapor deposition coating on a substrate is disclosed. In the process of this invention, a metallic wire mesh having an opening size is provided. An arc source, which is adapted to impart a positive charge on coating macroparticles produced during arc vapor deposition, is provided. A wire mesh is positioned in between the arc source and the substrate. A negative bias voltage is applied to the wire mesh. An arc vapor deposition coating is then deposited on the substrate, and the positively charged coating macroparticles are entrapped on the negatively charged wire mesh.

BRIEF DESCRIPTION OF THE DRAWINGS

FIG. 4 contains photomicrographs, at 1.05 k×, of the surface of a titanium nitride coating deposited on a steel substrate, without a bias wire mesh;

FIG. 5 contains photomicrographs, at 1.01 k×, of the surface of a titanium nitride coating deposited on a steel substrate, with a bias wire mesh according to the present invention;

BEST MODE FOR CARRYING OUT THE INVENTION

Figure 1:
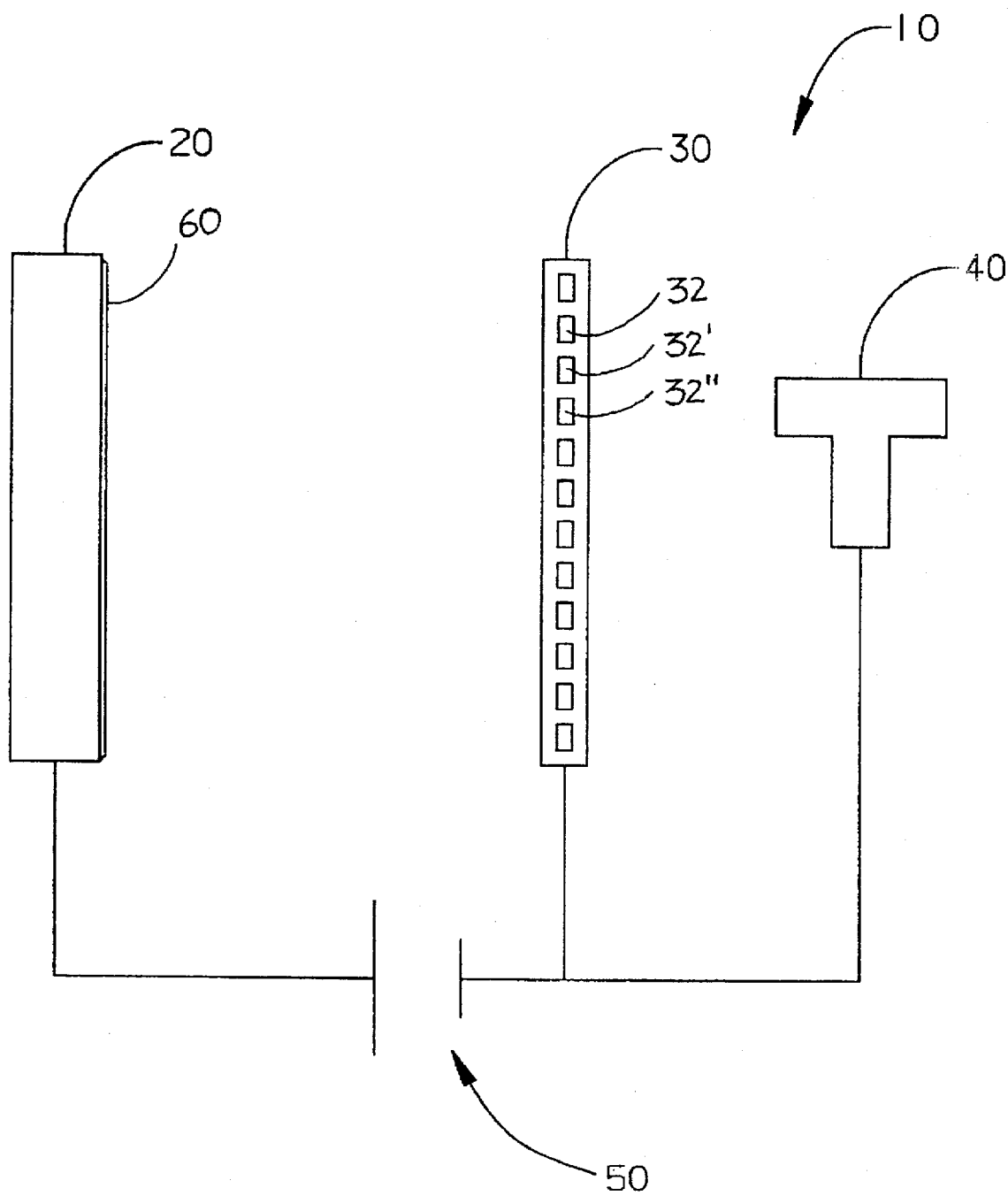
FIG. 1 is a diagrammatic view of the process of the present invention.

Referring to FIG. 1, an apparatus 10 is shown for carrying out the process for reducing particle defects in an arc vapor deposition coating on a substrate 20. The process comprises the following steps: A metallic wire mesh 30 having an opening size 32,32',32" (referred to hereinafter by one numeral 32, for purposes of brevity) is provided. An arc source 40 is provided. The arc source 40 is adapted to impart a positive charge on coating macroparticles produced during arc vapor deposition by an energizing source. The wire mesh 30 is positioned in between the arc source 40 and the substrate 20. A negative bias voltage is applied to the wire mesh 30 by a voltage source 50. An arc vapor deposition coating 60 is deposited on the substrate 20. The positively charged coating macroparticles are entrapped on the negatively charged wire mesh 30.

In the preferred embodiment of the present invention, the metallic wire mesh 30 is made from one of copper, aluminum, steel and stainless steel, and preferably, the wire mesh is made of stainless steel.

In the preferred embodiment of the present invention, the wire mesh opening 32 is desirably in the range of about 0.2235 mm (0.0088 inch) to about 0.864 mm (0.034 inch), and preferably, of about 0.467 mm (0.0185 inch). An opening size less than about 0.2235 mm is undesirable because the opening of the wire mesh becomes too small and detrimentally results in a reduction of the arc vapors passing through the wire mesh and depositing on the metal substrate, thus detrimentally affecting the coating quality, and undesirably reducing the coating deposition rate. An opening size greater than about 0.864 mm is undesirable because the opening of the wire mesh becomes too large and detrimentally allows an undesirable amount of macroparticles to pass through the wire mesh and reduce the coating quality.

In the preferred embodiment of the present invention, the arc source 40 is energized by an energizing source in order to vaporize the deposition material. The energizing imparts a positive charge on the macroparticles produced. The arc source 40 is energized desirably with a current in the range of about 50 Amps to about 250 Amps, and preferably, with a current of about 75 Amps. A current less than about 50 Amps is undesirable because it does not provide enough energy for stable vapor formation. A current greater than about 250 Amps is undesirable because it produces excessive macroparticles at a high velocity, thus detrimentally causing too many macroparticles to pass through the wire mesh.

In the preferred embodiment of the present invention, the wire mesh 30 is desirably positioned at a distance of at least 10 mm from the substrate 20 and preferably, at a distance of at least 15 mm. A distance of at least 10 mm is desirable to eliminate the macroparticles that were not trapped by the wire mesh but were only slowed down.

In the preferred embodiment of the present invention, the wire mesh 30 is desirably positioned at a distance in the range of about 10 mm to about 400 mm from the arc source 40, and preferably, at a distance of about 50 mm. A distance less than about 10 mm is undesirable because the macroparticle energy would overcome the entrapping effect of the wire mesh, thereby allowing excessive macroparticles to pass through it. A distance greater than about 400 mm is undesirable because the efficiency of macroparticle entrapment would diminish, since most macroparticles would not reach the wire mesh.

In the preferred embodiment of the present invention, the negative bias voltage is desirably in the range of about 20 volts to about 200 volts, and preferably, about 50 volts. A negative bias voltage less than about 20 volts is undesirable because it would not provide sufficient negative bias to entrap the macroparticles. A negative bias voltage greater than about 200 volts is undesirable because the high negative bias it would attract some of the vapor phase coating material, thus detrimentally reducing the coating deposition rate.

In the preferred embodiment of the present invention, desirably at least 50% by weight, and preferably, at least about 90% of the macroparticles produced are entrapped in the wire mesh 30. It is desirable to entrap at least about 50% of the macroparticles in order to significantly improve the coating integrity and quality.

In the preferred embodiment of the present invention, the coating is titanium nitride and the substrate is steel. Alternatively, any suitable coating materials such SiN, $Al_2O_3$, SiC, TaO for example, can be deposited on various substrates such as various metals and ceramics, for example. Such alternatively used coating and substrate materials are well known to those skilled in the art of arc vapor deposition techniques.

In the preferred embodiment of the present invention, the wire mesh 30 has a flat planar configuration. However, in another embodiment of this invention, the wire mesh is of a cylindrical configuration, with the arc source disposed within the wire mesh. Other alternate geometrical shapes are possible without departing from this invention.

EXAMPLE A

A titanium nitride coating was deposited on a steel substrate according to the process of the present invention. The wire mesh was a stainless steel wire mesh having an opening size of 0.0185 inches. It was positioned at a distance of 50 mm from an arc source. The arc source was positioned at a distance of 100 mm from the steel substrate. The arc source was energized with a current of 75 Amps. A negative bias voltage of 50 volts was applied to the wire mesh. A titanium nitride coating having a thickness of about 0.002 mm (2 microns) was deposited on the steel substrate. Photomicrographs were taken of the surface of this coating. These photomicrographs are shown in FIGS. 3, 5, and 7.

A titanium nitride coating was also deposited on a similar steel surface by conventional (proir art) process, without the negatively biased wire mesh. Photomicrographs were taken of the surface of this coating. These photomicrographs are shown in FIGS. 2, 4, and 6.

Figure 2:
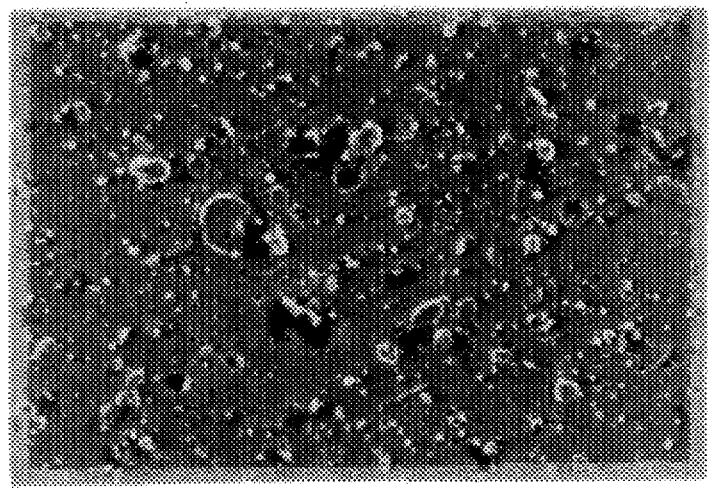
FIG. 2 contains photomicrographs, at 499×, of the surface of a titanium nitride coating deposited on steel substrate, without a bias wire mesh.
Figure 3:
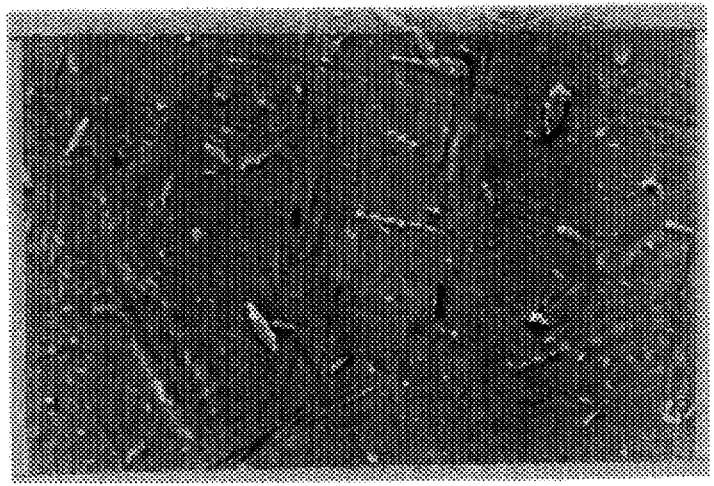
FIG. 3 contains photomicrographs, at 503×, of the surface of a titanium nitride coating deposited on a steel substrate, with a bias wire mesh according to the present invention.
Figure 6:
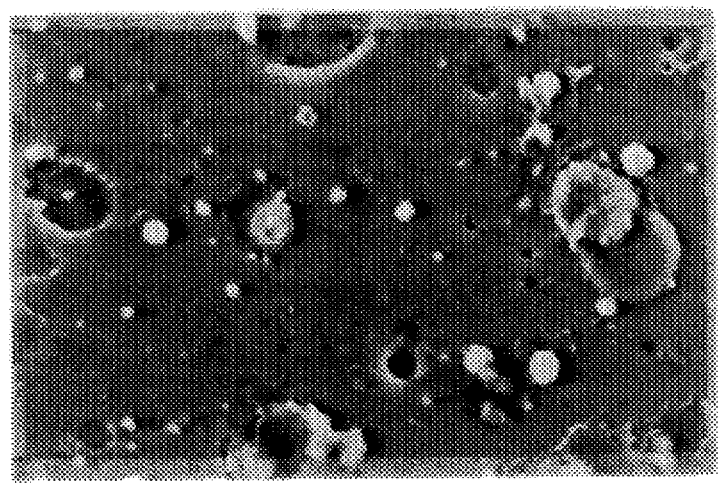
FIG. 6 contains photomicrographs, at 2.55 k× of the surface of a titanium nitride coating deposited on a steel substrate, without a bias wire mesh.
Figure 7:
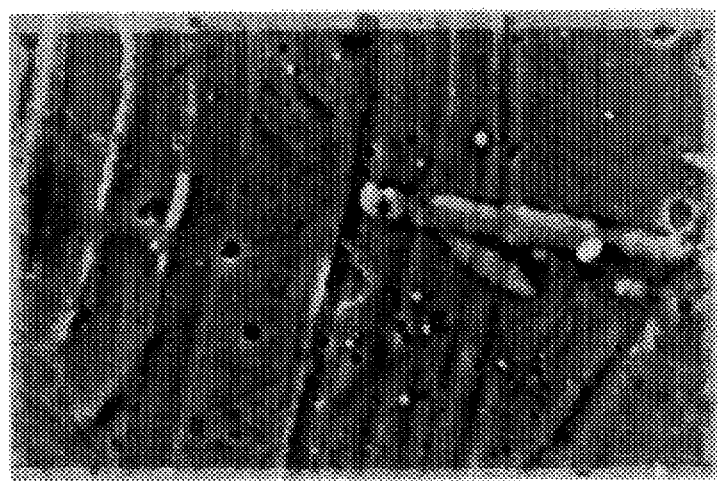
FIG. 7 contains photomicrographs, at 2.51 kX of the surface of a titanium nitride coating deposited on a steel substrate, with a bias wire mesh according to the present invention.

Referring to FIGS. 2–7, and comparing FIGS. FIGS. 2, 4, and 6 with FIGS. 3, 5, and 7, it is observed that the coating deposited by the proces of the present invention has a significant reduction in the deposition of macroparticles, thus improving the integrity of the coating.

INDUSTRIAL APPLICABILITY

The process of the present invention is particularly useful for depositing arc vapor deposition coatings with very few macroparticles. This process allows the flexibility to coat articles having various surface geometries without detrimentally affecting the deposition rate and without requiring expensive equipment. This invention thus represents a savings of time, labor, resources and equipment for the coating industry.

The process of the present invention is particularly useful for depositing wear resistant coatings of very high mechanical integrity on various wear surfaces.

Other aspects, objects and advantages of this invention can be obtained from a study of the drawings, the disclosure and the appended claims.

We claim:

1. A process for preventing particle defects in an arc vapor deposition coating on a substrate, comprising the steps of:

providing a metallic wire mesh having an opening size, providing a coating material, providing an arc source, said arc source being adapted to impart a positive charge on coating macroparticles produced during arc vapor deposition of said coating material onto said substrate, wherein said macroparticles are at least 0.1 µm in size, positioning said wire mesh in between said arc source and said substrate, applying a negative bias voltage to said wire mesh, depositing the arc vapor deposition coating of said coating material on said substrate, and entrapping said positively charged coating macroparticles on said negatively charged wire mesh.

2. A process, as set forth in claim 1, wherein said metallic wire mesh is made from one of copper, aluminum, and steel.

3. A process, as set forth in claim 2, wherein said metallic wire mesh is made of stainless steel.

4. A process, as set forth in claim 1, wherein said opening size is in the range of about 0.2235 mm (0.0088 inch) to about 0.864 mm (0.034 inch).

5. A process, as set forth in claim 4, wherein said opening size is about 0.467 mm (0.0185 inch).

6. A process, as set forth in claim 1, wherein said arc source is energized with a current in the range of about 50 Amps to about 250 Amps.

7. A process, as set forth in claim 6, wherein said arc source is energized with the current of about 75 Amps.

8. A process, as set forth in claim 1, wherein said wire mesh is positioned at a distance of at least 10 mm from said substrate.

9. A process, as set forth in claim 1, wherein said wire mesh is positioned at a distance in the range of about 10 mm to about 400 mm from said arc source.

10. A process, as set forth in claim 9, wherein said wire mesh is positioned at the distance of about 50 mm from said arc source.

11. A process, as set forth in claim 1, wherein said negative bias voltage is in the range of about 20 volts to about 200 volts.

12. A process, as set forth in claim 11, wherein said negative bias voltage is about 50 volts.

13. A process, as set forth in claim 1, wherein at least 50% by weight of said macroparticles produced are entrapped in the wire mesh.

14. A process, as set forth in claim 1, wherein said coating is titanium nitride and said substrate is steel.

* * * * *